(12) United States Patent
Hellinger et al.

(10) Patent No.: US 7,174,778 B2
(45) Date of Patent: Feb. 13, 2007

(54) CONTROL DEVICE FOR A MOTOR VEHICLE

(75) Inventors: Leopold Hellinger, Ziersdorf (AT); Gerhard Neumann, St. Margarethen (AT)

(73) Assignee: Siemens AG Austria, Vienna (AT)

( * ) Notice: Subject to any disclaimer, the term of this patent is extended or adjusted under 35 U.S.C. 154(b) by 0 days.

(21) Appl. No.: 10/996,042

(22) Filed: Nov. 24, 2004

(65) Prior Publication Data
US 2005/0109156 A1    May 26, 2005

(30) Foreign Application Priority Data
Nov. 24, 2003  (AT)  .............. A 1882/2003

(51) Int. Cl.
*G01M 13/02*  (2006.01)
(52) U.S. Cl. .............. 73/118.1; 73/39; 73/112; 73/116; 73/431
(58) Field of Classification Search .......... 73/39, 73/112, 118.1, 431
See application file for complete search history.

(56) References Cited
U.S. PATENT DOCUMENTS

| | | | | |
|---|---|---|---|---|
| 4,548,086 A | * | 10/1985 | Kastel ................ | 73/862.632 |
| 4,743,716 A | * | 5/1988 | Tsukioka ............... | 200/83 Y |
| 4,758,695 A | * | 7/1988 | Sanford et al. ......... | 200/83 P |
| 4,993,506 A | * | 2/1991 | Angel .................. | 177/211 |
| 5,212,989 A | * | 5/1993 | Kodama et al. ......... | 73/706 |
| 6,003,381 A | * | 12/1999 | Kato ................... | 73/721 |
| 6,192,743 B1 | * | 2/2001 | Perry .................. | 73/40 |
| 6,494,088 B2 | * | 12/2002 | Albert et al. .......... | 73/118.1 |
| 6,523,399 B2 | * | 2/2003 | Fritzsche et al. ....... | 73/118.1 |
| 6,880,405 B2 | * | 4/2005 | Mouhebaty et al. ...... | 73/723 |

* cited by examiner

*Primary Examiner*—Edward Lefkowitz
*Assistant Examiner*—Freddie Kirkland, III
(74) *Attorney, Agent, or Firm*—Staas & Halsey LLP

(57) ABSTRACT

Control device for a motor vehicle, particularly for controlling a gearbox, with an electronic control circuit arranged on a support plate in a housing; for measurement of the hydraulic pressure, a measuring transducer is connected to a hydraulic unit of the gearbox by a pressure channel, wherein a spring element is formed in a region of the support plate and is a portion of the measuring transducer; the spring element is connected for force transmission via a connecting member to a diaphragm which sealingly spans the aperture of the pressure channel leading to the spring element.

20 Claims, 4 Drawing Sheets

Cut A-A

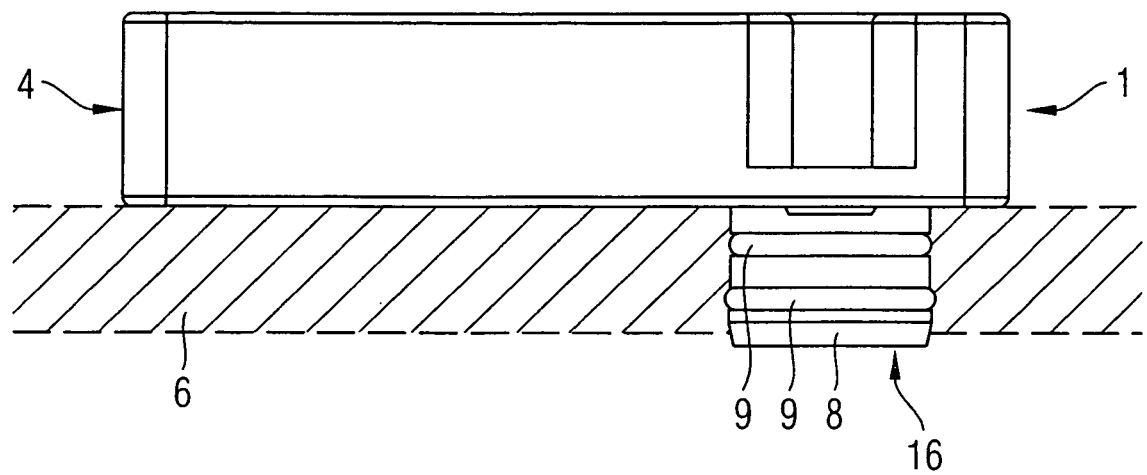
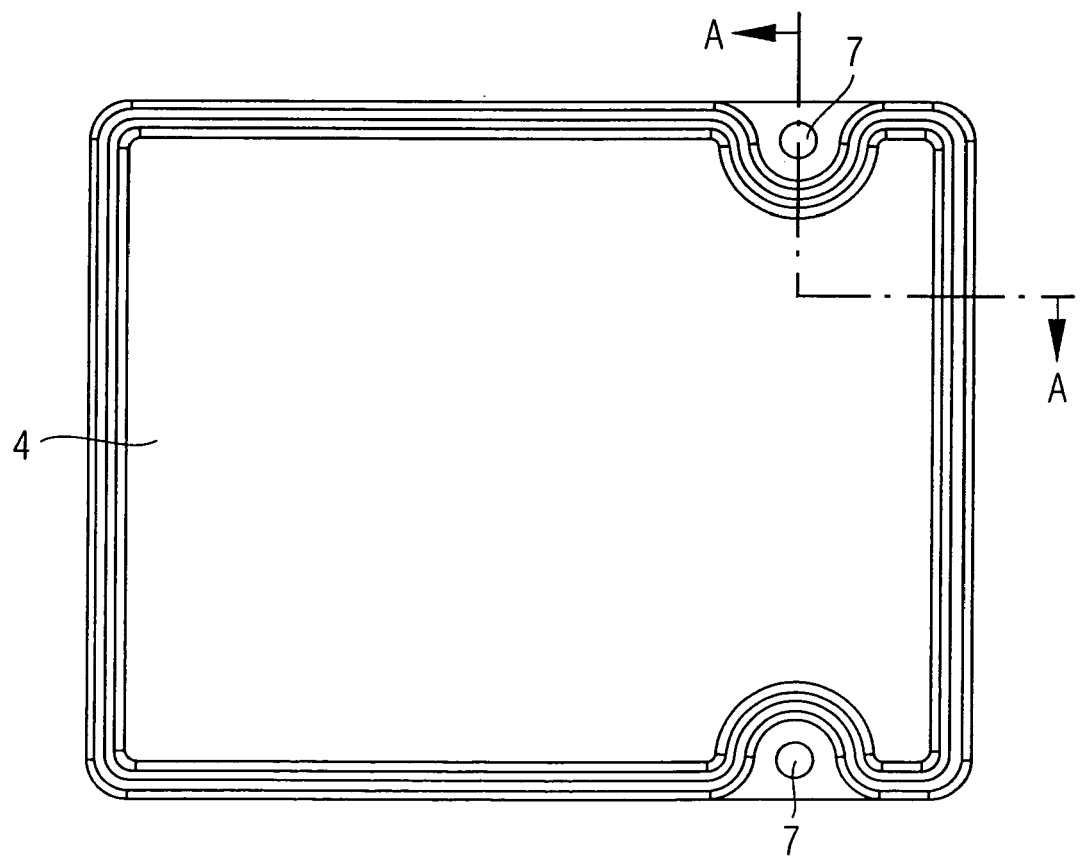

Cut A-A

Detail B

Detail B

CONTROL DEVICE FOR A MOTOR VEHICLE

CROSS REFERENCE TO RELATED APPLICATIONS

This application is based on and hereby claims priority to Austrian Application No. A1882/2003 filed Nov. 24, 2003, the contents of which are hereby incorporated by reference.

BACKGROUND OF THE INVENTION

The invention relates to a control device for a motor vehicle, particularly for the control of a gearbox, with an electronic control circuit arranged on a support plate in a housing; wherein a measurement transducer is present for measuring the hydraulic pressure, and is connected via a pressure channel to a hydraulic unit of the gearbox.

In production vehicles, highly developed electronic control devices are today used for the control of many functions, for example for the control of the gearbox. For control of an automatic transmission or an infinitely variable gearbox, the gearbox control processes signals of plural sensors, among others also pressure sensors which determine the hydraulic pressure in the gearbox, to control the gearbox. An aperture in the gearbox housing is usually provided for this purpose, in which a pressure channel with a measuring piston is formed. The measuring piston acts on a measuring transducer which converts the physical quantity, pressure, into an electrical signal. This signal is supplied to the gearbox control circuit card via a plug and connecting leads.

A disadvantage of this is that the electrical connection between the measuring transducer and gearbox control is not only technically expensive, but also susceptible to failure.

SUMMARY OF THE INVENTION

One aspect of the present invention is based on the problem of providing a control device in which the connection between the measuring transducer and the control circuit is as simply and reliably embodied as possible.

The inventors propose to form in a region of the support plate a spring element which is a portion of a measuring transducer, the spring element being connected for force transmission to a diaphragm which sealingly spans the aperture of the pressure channel leading to the spring element.

A mechatronic module is provided by this construction, in which the heretofore required electrical conducting leads, susceptible to failure, between the gearbox control and the spatially remotely located measuring transducer are omitted.

Various measurement principles, known per se, are available to choose from for converting the bending of the spring element into an electrical signal: for example, a resistance change of a conductor structure.

The spring element may be produced in a simple manner in that the circuit carrier, for example a printed circuit card, is cut at the edge. There thus results a tongue-shaped support member onto which a strain gauge strip can be applied by adhesion. For hydraulic pressure measurement, the evaluation circuits known for strain gauge strips may be used.

In another preferred alternative. it is provided that a permanent magnet is installed on the spring element. The deflection of the spring element can then be detected by a magnetic field sensor fixed to the support plate. The electrical output signal of the measuring transducer is further supplied to the control electronics via a conductor structure on the support plate.

The control device is preferably used as a mechatronic add-on module, the housing of which is built on externally onto a wall of the gearbox housing. A hollow cylindrical projection is formed on the base portion of the housing, and is passed through an aperture of the gearbox housing.

Manufacture is particularly simple if the diaphragm, the connecting member and the base portion are produced integrally as an injection molded part.

A compact structure is thereby attained, in that the diaphragm in the hollow cylindrical projection is arranged about in the region of the floor plate, i.e. near the support plate.

Production using polymeric materials is preferred. It is found to be advantageous here if the diaphragm is injection molded in the hollow cylindrical projection. Furthermore it can be advantageous if the diaphragm is formed of a polymeric material which has a Shore hardness smaller than the Shore hardness of the material of the base portion.

Sealing of the base portion in the housing feed-through can take place in a simple manner with O-rings formed in annular grooves of the outer envelope surface of the hollow cylindrical projection.

For the introduction of force to the spring element, it is favorable if the end of the pressure channel remote from the hydraulic unit passes substantially perpendicularly of the plane of the support plate.

The support portion is supported by support screws on the base portion in the region of leading-in of the pressure channel. The support plate is thereby prevented from bulging out and falsifying the measurement value.

BRIEF DESCRIPTION OF THE DRAWINGS

These and other objects and advantages of the present invention will become more apparent and more readily appreciated from the following description of the preferred embodiments, taken in conjunction with the accompanying drawings of which:

FIG. 1 shows the control device according to one embodiment of the invention mounted on an edge of a gearbox housing, in side view;

FIG. 2 shows the control device of FIG. 1, in a plan view;

DETAILED DESCRIPTION OF THE PREFERRED EMBODIMENT

Figure 3:
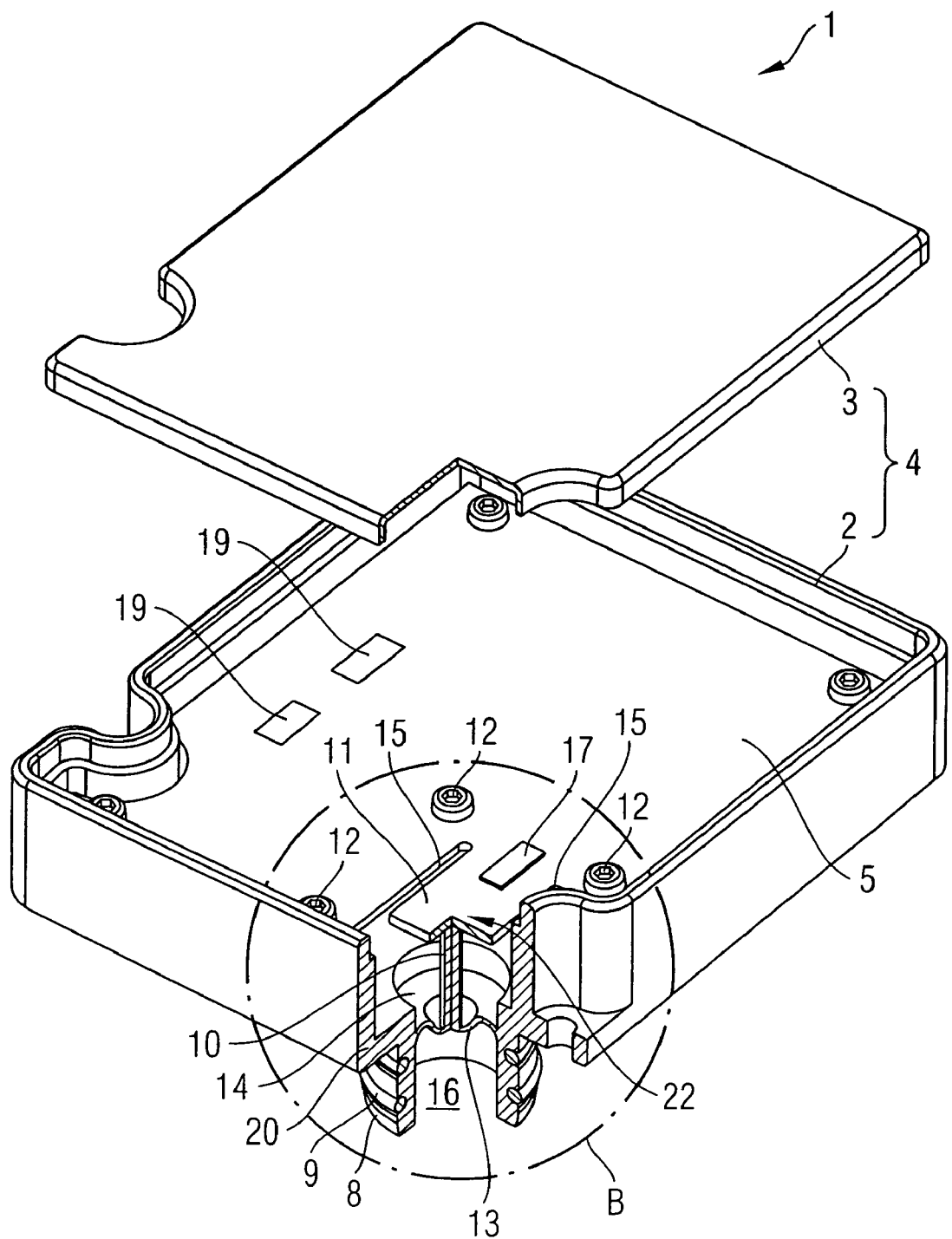
FIG. 3 shows a control device according to one embodiment of the invention in a perspective view in which the cover portion is raised.

FIG. 1 shows the control device 1 in a preferred mounting position externally on the gearbox housing. The housing 4 is screwed onto the wall 6 of a transfer gearbox by fastening screws 7 (FIG. 2). The electronic control circuit is protected from external effects by the housing 4. The hollow cylindrical projection 8 is formed on the side facing the gearbox. The hollow cylindrical projection 8 is sealed by seals 9 in the housing wall 6 and forms a portion of a pressure channel 16 which connects a measuring transducer 22 (FIG. 2) to a hydraulic unit (not shown in detail) of the gearbox. In the drawing, the plug and connecting leads, and also pressure equalizing elements known per se, which connect the interior of the housing with the exterior, are not shown for the sake of clarity.

FIG. 3 shows a perspective view of the housing 4 with the cover portion 3 raised from the base portion 2 in a partially cut-away diagram along the line A—A in FIG. 2.

The base portion 2, whose floor plate 20 abuts directly on the wall 6 of the gearbox housing, is made of polyamide to which glass fiber is admixed, and is produced by injection molding. The plastic used us temperature-stable up to 140° C. and is particularly oil- and vibration-resistant.

As can easily be seen from the opened view of FIG. 3, the housing 4 contains the measuring transducer 22 and a control circuit, which is indicated by electronic components 19 on a printed circuit board 5. A tongue-shaped spring element 11 is formed on the printed circuit card 5, opposite a feed of the pressure channel. The spring element 11 is formed in the printed circuit card 5 by edge cuts 15 running about parallel to one another. The spring element 11 acts as a measuring member and forms a portion of the measuring transducer 22; its mode of operation is described in detail hereinafter.

The housing side aperture 14 of the pressure channel 16 is closed by a diaphragm 13. The diaphragm 13 has connecting member 10 of push rod form on its side remote from the pressure actuation, coupling the diaphragm 13 to the spring element 11 of the circuit support 5. The region of the printed circuit card 5 in which the measuring transducer 22 is formed is supported on the base portion 2 of the housing 4 by support screws 12.

Figure 4:
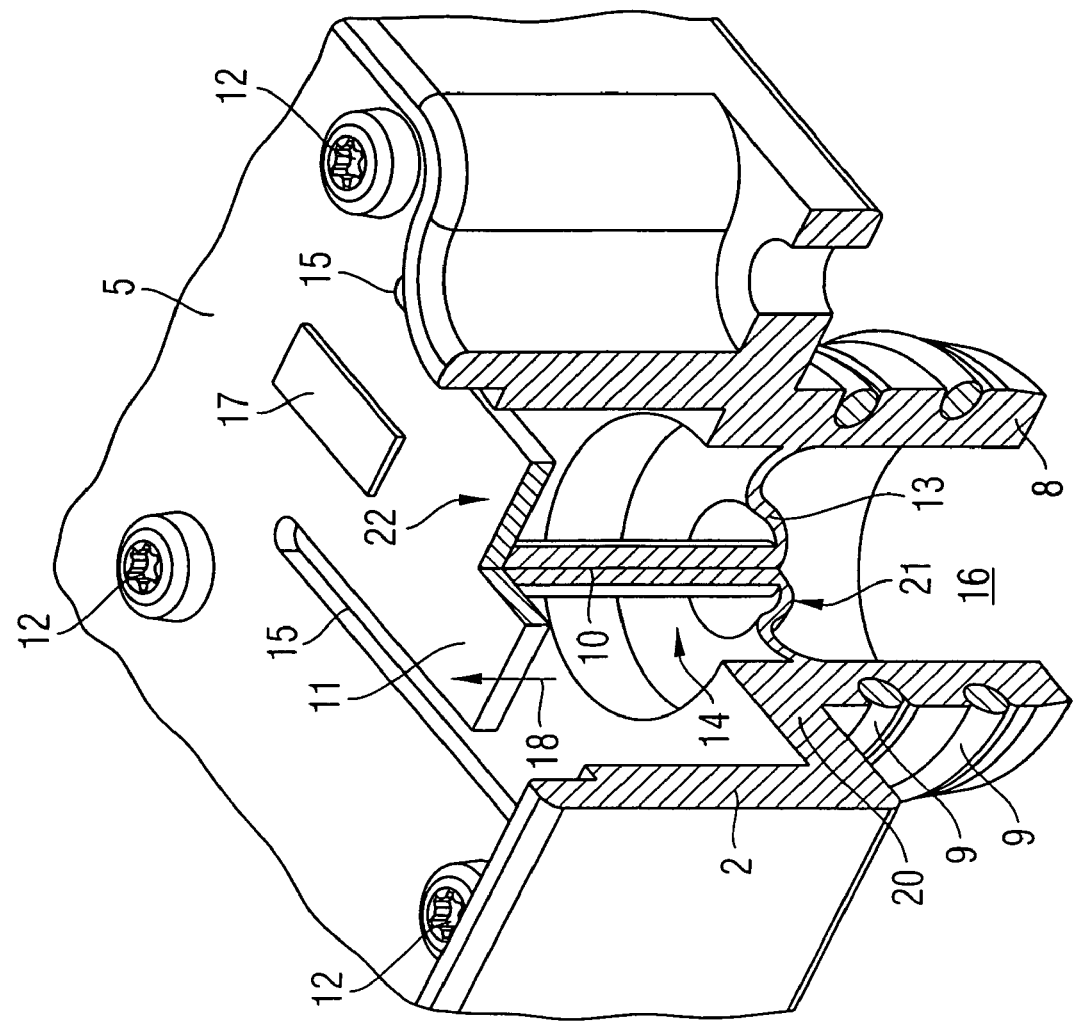
FIG. 4 shows a first alternative of the measuring transducer in an enlarged view of the detail B of FIG. 3.
Figure 5:
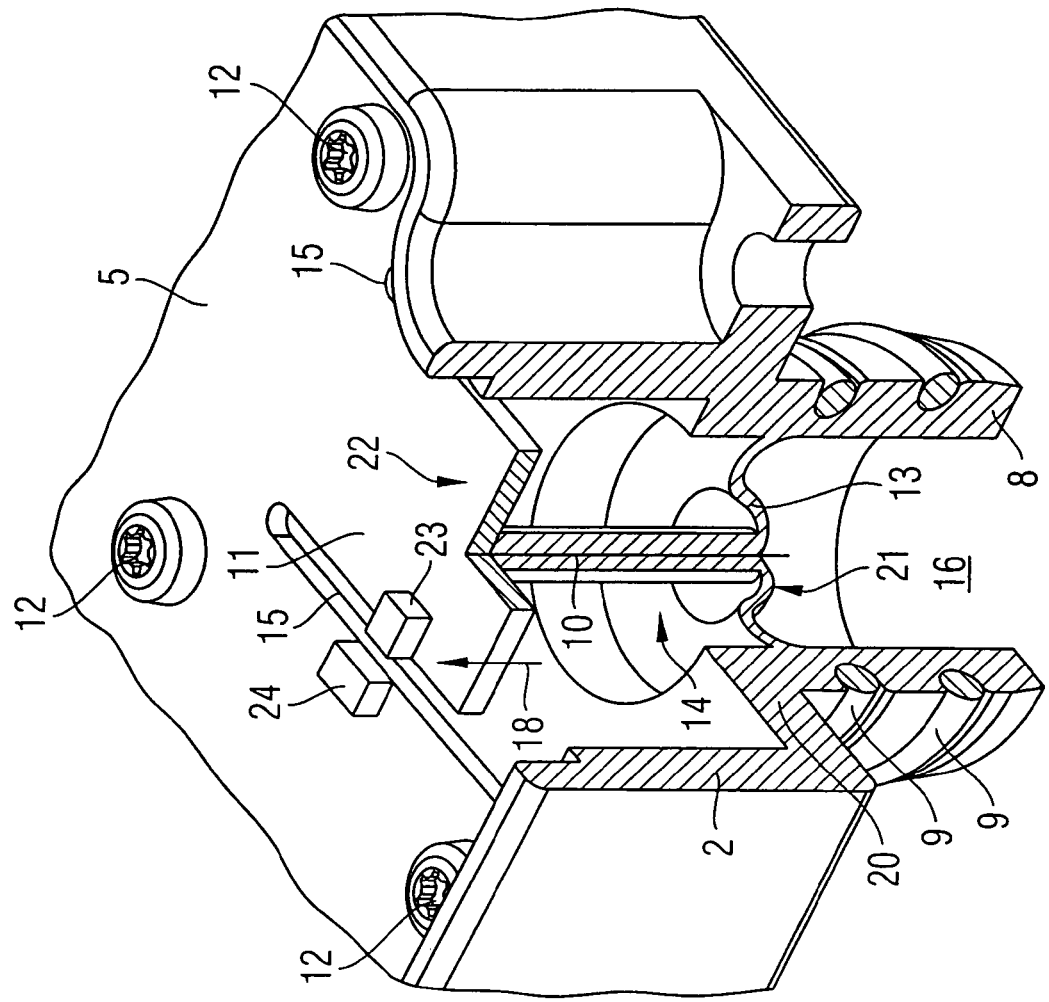
FIG. 5 shows a second variant of the measuring transducer in an enlarged view of the detail B of FIG. 3.

The mode of functioning of the hydraulic pressure measurement may best be explained using FIG. 4, in which the detail B of FIG. 3 is greatly enlarged.

As soon as the hydraulic unit of the gearbox builds up a pressure in the hydraulic system of the motor vehicle, this pressure reaches the diaphragm 13 via the pressure channel 16. The pin-shaped portion 10 produces a force-transmitting connection to the resilient element 11 of the support plate. Due to the flexurally stiff coupling between the diaphragm 13 and the spring element 11, a corresponding bending of the spring element 11 occurs, according to the magnitude of the hydraulic pressure. An increase in the hydraulic pressure causes a bending of the beam 11, to which stress is applied on one side. In practice the deflection is less than about a millimeter. The bending is indicated in FIG. 4 by an arrow referenced 18. A strain gauge strip 17 is fastened to the spring element 11 by an adhesive. The bending stress or shear stress of the beam-shaped portion 11 is detected by measurement technology by this strain gauge strip 17, for example by determination of a diagonal voltage of a bridge circuit. This measurement voltage is supplied in conductors (not shown in detail) of the control circuit 19 to the support plate 5 and is directly evaluated, for example by a microcontroller. The microcomputer converts the bending into a pressure value.

During production, the strain gauge strip 17 can be inserted by a SMD automatic insertion machine and then soldered to the printed circuit board in a reflow process, together with the other components 19 of the control circuit. There is a considerable production cost advantage in comparison with the related art described at the beginning.

A space-saving construction results from the integration of the measuring transducer 22 with the support plate 5 or the control circuit as the construction and connection technique. The short transmission path between the measuring transformer 22 and the electronic components 19 of the control circuit is favorable as regards reliability and susceptibility to failure. According to the embodiment of the strain gauge strip 17, this can be arranged on the shear side or the pressure side of the spring element 11.

The diaphragm 13 is made of plastic in the embodiment example shown, and is materially integral with the base portion 2 of the housing 4 produced by injection molding. The diaphragm 13 is located in the pressure channel 16 about at the level of the floor plate 20 of the base housing portion 2. Alternatively to the materially integral embodiment, the diaphragm 13 can also be produced by supplementary injection, the material for the diaphragm 13 being a softer plastic than the plastic of the base portion 2.

It is of course also possible for the base portion to be formed from a metal, for example diecast aluminum, and for the diaphragm 13 to be formed as a built-in portion which is pressed into the pressure channel 16. It is also conceivable that the diaphragm is made of metal and the actuating pin 10 is welded to the side remote from the pressure side 21.

In an alternative of the pressure receiver 22, a permanent magnet 23 is fixed to the spring member 11. A magnetic sensor 24 is arranged on the opposite side of the cut 15, and again detects the deflection of the spring element 11 caused by the hydraulic pressure as a change of the magnetic field. Here also, the microcontroller can perform a conversion from the electrical output signal of the magnetic sensor 24 into a pressure value.

A stop can be provided in both embodiments for limiting the deflection of the spring element. It is likewise conceivable that a supporting sheet metal portion is provided for increasing the bending stiffness at the spring element 11.

The invention has been described in detail with particular reference to preferred embodiments thereof and examples, but it will be understood that variations and modifications can be effected within the spirit and scope of the invention covered by the claims which may include the phrase "at least one of A, B and C" or a similar phrase as an alternative expression that means one or more of A, B and C may be used, contrary to the holding in *Superguide v. DIRECTV*, 69 USPQ2d 1865 (Fed. Cir. 2004).

What is claimed is:

1. A control device for a motor vehicle gearbox, comprising:
   a support plate in a housing;
   an electronic control circuit provided on the support plate;
   a pressure channel connected to a hydraulic unit of the gearbox, the pressure channel having an aperture;
   a measuring transducer for measuring hydraulic pressure in the pressure channel, the measuring transducer having a spring element formed in the vicinity of the support plate;
   a diaphragm which sealingly spans over the aperture of the pressure channel; and
   a connecting element to connect the spring element to the diaphragm for force transmission wherein the spring element is formed integrally from a portion of the support plate.

2. The device according to claim 1, wherein
   edge cuts are present in the support plate to define a tongue in the support plate, and
   the spring element is formed from the tongue.

3. The device according to claim 2, wherein
   a strain gauge strip is installed on the spring element to detect deflection of the spring element.

4. The device according to claim 3, further comprising:
   a permanent magnet provided on the spring element; and a magnetic field dependent sensor provided on the support plate to detect deflection of the spring element through the permanent magnet.

5. The control device according to claim 4, wherein
the housing has a base provided on a wall of the gearbox,
the gearbox has an aperture,
the pressure channel is formed from a hollow cylindrical projection from the base of the housing, the hollow cylindrical projection projecting through the aperture in the gearbox.

6. The control device according to claim 5, wherein the diaphragm, the connecting member and the base of the housing are produced integrally as an injection molded part.

7. The control device according to claim 6, wherein
the base of the housing has a floor plate, and
the diaphragm extends through the hollow cylindrical projection so as to be substantially co-planar with the floor plate.

8. The control device according to claim 7, wherein
the diaphragm is injection molded into the hollow cylindrical projection, and
the diaphragm is formed from a polymeric material which has a Shore hardness smaller than the Shore hardness of the base of the housing.

9. The control device according to claim 8, wherein annular grooves for receiving annular sealing elements are provided on an outer envelope surface of the hollow cylindrical projection.

10. The control device according to claim 9, wherein
the pressure channel has an end that extends away from the hydraulic unit of the gearbox, and
the end of the pressure channel conducts hydraulic fluid in a direction substantially perpendicular to the plane of the support plate.

11. The control device according to claim 10, wherein
the housing has a base,
the support plate is connected to the base of the housing with screws provided in the vicinity of the pressure channel.

12. The device according to claim 1, wherein
a strain gauge strip is installed on the spring element to detect deflection of the spring element.

13. The device according to claim 1, further comprising:
a permanent magnet provided on the spring element; and
a magnetic field dependent sensor provided on the support plate to detect deflection of the spring element through the permanent magnet.

14. The control device according to claim 1, wherein
the housing has a base provided on a wall of the gearbox,
the gearbox has an aperture,
the pressure channel is formed from a hollow cylindrical projection from the base of the housing, the hollow cylindrical projection projecting through the aperture in the gearbox.

15. The control device according to claim 14, wherein the diaphragm, the connecting member and the base of the housing are produced integrally as an injection molded part.

16. The control device according to claim 15, wherein
the diaphragm is injection molded into the hollow cylindrical projection, and
the diaphragm is formed from a polymeric material which has a Shore hardness smaller than the Shore hardness of the material of the base of the housing.

17. The control device according to claim 14, wherein
the base of the housing has a floor plate, and
the diaphragm extends through the hollow cylindrical projection in the vicinity of the floor plate.

18. The control device according to claim 14, wherein annular grooves for receiving annular sealing elements are provided on an outer envelope surface of the hollow cylindrical projection.

19. The control device according to claim 1, wherein
the pressure channel has an end that extends away from the hydraulic unit, and
the end of the pressure channel conducts hydraulic fluid in a direction substantially perpendicular to the plane of the support plate.

20. The control device according to claim 1, wherein
the housing has a base,
the support plate is connected to the base of the housing with screws provided in the vicinity of the pressure channel.

* * * * *